United States Patent
Kittl et al.

(10) Patent No.: US 10,763,207 B2
(45) Date of Patent: Sep. 1, 2020

(54) INTERCONNECTS HAVING LONG GRAINS AND METHODS OF MANUFACTURING THE SAME

(71) Applicant: Samsung Electronics Co., Ltd., Suwon-si, Gyeonggi-do (KR)

(72) Inventors: Jorge A. Kittl, Austin, TX (US); Ganesh Hegde, Austin, TX (US); Harsono Simka, Saratoga, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/939,211

(22) Filed: Mar. 28, 2018

(65) Prior Publication Data

US 2019/0157200 A1    May 23, 2019

Related U.S. Application Data (60) Provisional application No. 62/589,529, filed on Nov. 21, 2017.

(51) Int. Cl.
*H01L 23/522* (2006.01)
*H01L 21/768* (2006.01)
(Continued)

(52) U.S. Cl.
CPC .... *H01L 23/5226* (2013.01); *H01L 21/76834* (2013.01); *H01L 21/76877* (2013.01);
(Continued)

(58) Field of Classification Search
CPC ................. H01L 23/5226; H01L 27/76877
See application file for complete search history.

(56) References Cited

U.S. PATENT DOCUMENTS 5,472,911 A * 12/1995 Dreyer ............... H01L 23/5283
257/E23.152
5,541,455 A 7/1996 Hodges
(Continued)

FOREIGN PATENT DOCUMENTS

| EP | 2070112 A2 | 6/2009 |
|---|---|---|
| JP | 2003-297749 A | 10/2003 |
| JP | 2011-086934 | 4/2011 |

OTHER PUBLICATIONS

Steenwyk, S.D., et al., "Electromigration in Aluminum to Tantalum Silicide Contacts", Reliability Physics Symposium, 1986, pp. 30-37.
(Continued)

*Primary Examiner* — Walter H Swanson
(74) *Attorney, Agent, or Firm* — Lewis Roca Rothgerber Christie LLP (57) ABSTRACT

A method of manufacturing metallic interconnects for an integrated circuit includes forming an interconnect layout including at least one line including a non-diffusing material, forming a diffusing barrier layer on the line, forming an opening extending completely through the diffusing barrier layer and exposing a portion of the line, depositing a diffusing layer on the diffusing barrier layer such that a portion of the diffusing layer contacts the portion of the line, and thermally reacting the diffusing layer to form the metallic interconnects. Thermally reacting the diffusing layer chemically diffuses a material of the diffusing layer into the at least one line and causes at least one crystalline grain to grow along a length of the at least one line from at least one nucleation site defined at an interface between the portions of the diffusing layer and the line.

1 Claim, 7 Drawing Sheets

(51) Int. Cl.
*H01L 23/528* (2006.01)
*H01L 23/532* (2006.01)

(52) U.S. Cl.
CPC ...... *H01L 21/76889* (2013.01); *H01L 23/528* (2013.01); *H01L 23/53209* (2013.01); *H01L 23/53271* (2013.01)

(56) References Cited

U.S. PATENT DOCUMENTS

| | | | |
|---|---|---|---|
| 5,731,239 | A | 3/1998 | Wong et al. |
| 6,147,405 | A | 11/2000 | Hu |
| 6,242,333 | B1 | 6/2001 | McNeil et al. |
| 6,262,458 | B1 | 7/2001 | Hu |
| 6,429,455 | B1 | 8/2002 | McNeil et al. |
| 6,617,242 | B1 | 9/2003 | Chen et al. |
| 7,952,146 | B2 | 5/2011 | Yang et al. |
| 7,956,463 | B2 | 6/2011 | Yang et al. |
| 7,983,344 | B2 | 7/2011 | Giammaressi |
| 8,089,157 | B2 | 1/2012 | Cabral, Jr. et al. |
| 8,344,460 | B2 | 1/2013 | Kittl |
| 8,922,018 | B2 | 12/2014 | Ishizaki et al. |
| 9,171,801 | B2 | 10/2015 | Bao et al. |
| 2007/0197012 | A1* | 8/2007 | Yang ................ H01L 21/76805 438/597 |
| 2008/0296660 | A1 | 12/2008 | Park et al. |
| 2008/0311739 | A1 | 12/2008 | Besling et al. |
| 2009/0315182 | A1 | 12/2009 | Besser et al. |
| 2010/0013107 | A1* | 1/2010 | Sandhu ............ H01L 21/76816 257/777 |
| 2012/0080793 | A1* | 4/2012 | Danek ............... H01L 21/28562 257/751 |
| 2014/0374904 | A1* | 12/2014 | Matsumoto ......... H01L 23/5226 257/741 |
| 2017/0229344 | A1 | 8/2017 | Murray et al. |
| 2018/0182708 | A1* | 6/2018 | Ahmed ............. H01L 23/53209 |
| 2018/0204759 | A1* | 7/2018 | Bruce ............... H01L 23/53295 |

OTHER PUBLICATIONS

Zehe, A., "The stress-induced escape of migrating aluminum from silicide interconnects", Semiconductor Science and Technology, vol. 16, pp. 817-821, Aug. 9, 2001.

Kittl et al., "Work Function of Ni Silicide Phases on HfSiON and SiO2: NiSi, Ni2Si, Ni31Si12, and Ni3Si Fully Silicided Gates," IEEE Electron Device Letters, 27(1): 34-36; Jan. 2006.

Kittl et al., "Direct evidence of linewidth effect: Ni31Si12 and Ni3Si formation on 25 nm Ni fully shielded gates," Applied Physics Letters, 90, 4 pages, 2007.

* cited by examiner

INTERCONNECTS HAVING LONG GRAINS AND METHODS OF MANUFACTURING THE SAME

CROSS-REFERENCE TO RELATED APPLICATION

The present application claims priority to and the benefit of U.S. Provisional Application No. 62/589,529, filed Nov. 21, 2017, the entire contents of which are incorporated herein by reference.

FIELD

The present disclosure relates generally to interconnects and methods and manufacturing the same.

BACKGROUND

Back-end-of-line (BEOL) interconnects are utilized in integrated circuits to interconnect the individual devices of the circuit (e.g., transistors) together, and for making chip-to-package connections.

However, related art interconnects typically include relatively short crystalline grains. For instance, related art interconnects are typically formed by reacting a metal layer with semiconductor lines that are continuously in contact with the metal layer. During this related art process, silicide nucleates everywhere along the semiconductor lines, which results in a small grain structure.

For ultra-scaled line widths (e.g., interconnects having a line width of approximately 20 nm or less and/or interconnects having a cross-sectional area of less than approximately 100 nm$^2$), these relatively short crystalline grains may result in a relatively large electrical resistance in the interconnects. A significant contributor to the large electrical resistance of related art interconnects is grain boundary scattering.

Additionally, proposed related art methods to achieve relatively longer crystalline grains in the interconnect lines, such as liner engineering and recrystallization anneal methods, still result in interconnects having a large electrical line resistance at ultra-scaled line widths.

SUMMARY

The present disclosure is directed to various embodiments of a method of manufacturing metallic interconnects for an integrated circuit. In one embodiment, the method includes forming an interconnect layout including at least one line formed of a non-diffusing material, forming a diffusing barrier layer on the at least one line, forming at least one opening in the diffusing barrier layer extending completely through the diffusing barrier layer and exposing a portion of the at least one line, depositing a diffusing layer on the diffusing barrier layer such that a portion of the diffusing layer contacts the portion of the at least one line, and thermally reacting at least a portion of the diffusing layer to form the metallic interconnects. The thermally reacting the diffusing layer chemically diffuses a material of the diffusing layer into the at least one line and causes at least one crystalline grain to grow along a length of the at least one line from at least one nucleation site defined at an interface between the portion of the diffusing layer and the portion of the at least one line.

Thermally reacting the diffusing layer may silicidize the at least one line.

The portion of the diffusing layer may extend down through the at least one opening in the diffusing barrier layer.

The portion of the at least one line may extend up through the at least one opening in the diffusing barrier layer.

The diffusing barrier layer may be an insulator.

The non-diffusing material may be amorphous silicon or polycrystalline silicon.

The diffusing layer may include a metal, such as nickel, or a metal alloy, such as nickel alloy.

The method may include selectively removing unreacted material of the diffusing layer after thermally reacting the diffusing layer. The method may also include selectively removing the diffusing barrier layer after selectively removing the unreacted material of the diffusing layer.

Forming the interconnect layout may include depositing the non-diffusing material and patterning the non-diffusing material into the at least one line, or conformal deposition of the non-diffusing material into at damascene trench pattern in an insulating layer.

The method may include forming at least one landing pad in the at least one line Thermally reacting the diffusing layer may be performed at a temperature from approximately 350° C. to approximately 550° C.

The present disclosure is also directed to various embodiments of an interconnect for an integrated circuit. In one embodiment, the interconnect includes a pattern of metallic interconnect lines, wherein each metallic interconnect line of the pattern includes at least one crystalline grain having a length from approximately 20 nm to approximately 500 nm along a length of the respective metallic interconnect line.

Each metallic interconnect line of the pattern may have a width of approximately 20 nm or less.

Each metallic interconnect line of the pattern may include silicide.

At least one metallic interconnect line may include a single crystalline grain.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

The present disclosure is directed to various embodiments of interconnects for integrated circuits and methods of manufacturing the same. The interconnects of the present disclosure have longer crystalline grains than related art interconnects, which is configured to reduce the electrical resistance of the interconnects compared to related art interconnects having relatively shorter crystalline grains.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
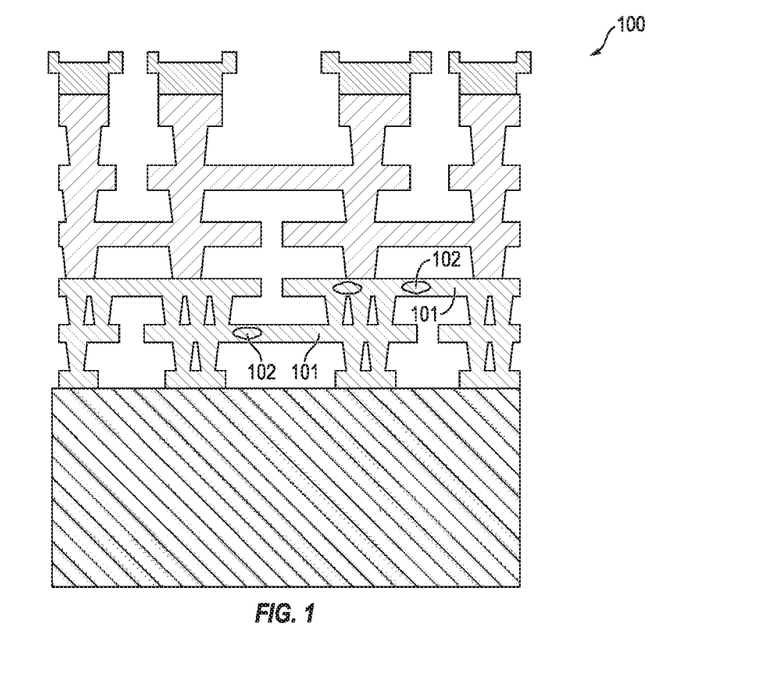
FIG. 1 is a side view of a circuit including metallic interconnects according to one embodiment of the present disclosure.

With reference now to FIG. 1, an integrated circuit 100 according to one embodiment of the present disclose includes a pattern of metallic interconnects 101. In one or more embodiments, the interconnects 101 may be located at any suitable lower back-end-of-line (BEOL) metal level. For instance, in one or more embodiments, the interconnects 101 may be located at lower metal layer M0, lower metal layer M1, or lower metal layer M2 or higher. The interconnects 101 may be formed of any suitable metallic compound, such as silicide. Additionally, in the illustrated embodiment, the interconnects 101 may have a width less than approximately 20 nm (e.g., approximately 15 nm or less, or approximately 10 nm or less). In one or more embodiments, the interconnects 101 may have a cross-sectional area of approximately 200 nm$^2$ or less (e.g., approximately 100 nm$^2$ or less).

In one or more embodiments, the interconnects 101 include crystalline grains (e.g., silicide crystalline grains) 102 having a length along the length of interconnects 101 of from approximately 20 nm to approximately 500 nm. In one or more embodiments, the interconnects 101 include crystalline grains (e.g., silicide crystalline grains) 102 having a length along the length of interconnects 101 of from approximately 20 nm to approximately 200 nm. In one or more embodiments, the interconnects 101 include crystalline grains (e.g., silicide crystalline grains) 102 having a length along the length of interconnects 101 of from approximately 50 nm to approximately 100 nm. In one or more embodiments, the interconnects 101 may include crystalline grains 102 having a length of approximately 20 nm or greater, approximately 30 nm or greater, approximately 50 nm or greater, approximately 100 nm or greater, approximately 200 nm or greater, or up to approximately 500 nm. In one or more embodiments, one or more of the metallic interconnects 101 may include a single crystalline grain 102 (e.g., one or more of the interconnect lines may include a single silicide crystalline grain). In one or more embodiments, the metallic interconnects 101 of the present disclosure include crystalline grains 102 having longer lengths than related art metallic interconnects. The relatively longer crystalline grains 102 of the metallic interconnects 101 of the present disclosure are configured to reduce the electrical resistance in the metallic interconnects 101 compared to related art metallic interconnects having relatively shorter grain lengths.

FIGS. 2A-2M depict tasks of forming metallic interconnects for an integrated circuit according to one embodiment of the present disclosure. In FIGS. 2A-2M the underlying structure of the integrated circuit (e.g., transistors) on which the metallic interconnects are formed is omitted for clarity.

Figure 2A:
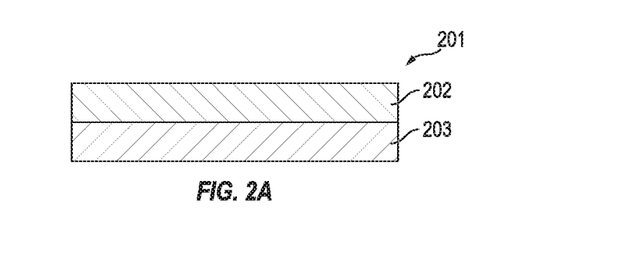
FIGS. 2A-2B are a side view and a top view, respectively, illustrating a task of forming metallic interconnects according to one embodiment of the present disclosure.
Figure 2B:
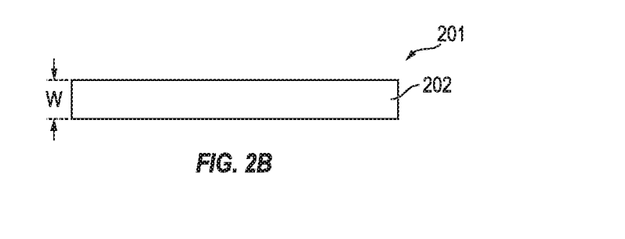

With reference now to FIGS. 2A-2B, the method of forming the metallic interconnects 200 according to one embodiment of the present disclosure includes forming an interconnect layout 201 including a series of lines 202 on an insulating layer 203. In one or more embodiments, each of the lines 202 may have a width W less than approximately 20 nm (e.g., approximately 10 nm or less). In one or more embodiments, the lines 202 may be formed from a non-diffusing material, such as a semi-conductor material (e.g., amorphous silicon (a-Si), poly silicon (poly-Si), or SiGe). In one or more embodiments, the task of forming the lines 202 of the interconnect layout 201 may include depositing the non-diffusing material (e.g., the semi-conductor material, such as a-Si, poly-Si, or SiGe) and then patterning the deposited non-diffusing material (e.g., by etching) to form the lines 202. In one or more embodiments, the task of forming the lines 202 of the interconnect layout 201 may include conformal deposition of the non-diffusing material (e.g., the semi-conductor material, such as a-Si, poly-Si, or SiGe) in a damascene trench pattern in an insulating layer. The damascene trench pattern has a configuration corresponding to the desired configuration of the interconnect layout 201 of the lines 202. The interconnect layout 201 of the lines 202 may have any suitable configuration depending on the configuration of the integrated circuit (e.g., the configuration of the transistors) with which the metallic interconnects 200 are configured to be utilized.

Figure 2C:
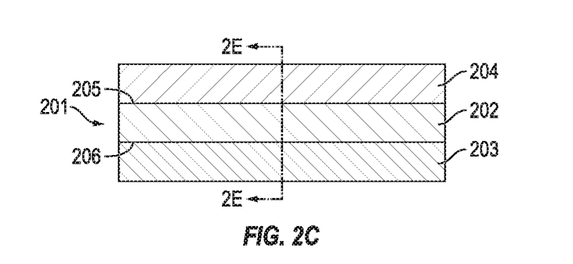
FIGS. 2C-2E are a side view, a top view, and a cross-sectional view, respectively, illustrating another task of forming the metallic interconnects according to one embodiment of the present disclosure.
Figure 2D:
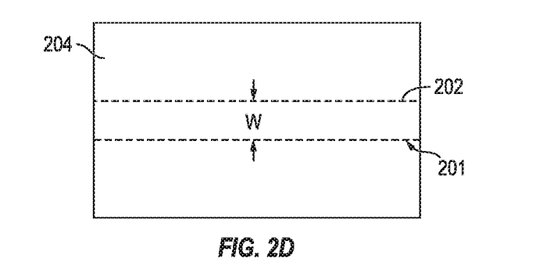
Figure 2E:
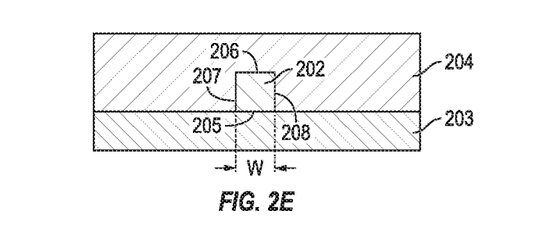

With reference now to FIGS. 2C-2E, the method of forming the metallic interconnects 200 also includes forming (e.g., depositing) a diffusing barrier layer 204 on the lines 202 of the interconnect layout 201 (e.g., covering the lines 202 of the interconnect layout 201 with a diffusing barrier layer 204). In the illustrated embodiment, lower surfaces 205 of the lines 202 are in contact (e.g., direct contact) with the underlying insulating layer 203, and upper surfaces 206 of the lines 202 opposite the lower surfaces 205 are in contact (e.g., direct contact) with the diffusing barrier layer 204 (e.g., the upper insulating layer). In one or more embodiments, the diffusing barrier layer 204 may include an insulating material (e.g., the diffusing barrier layer 204 may be an upper insulating layer on the upper surfaces 206 of the lines 202 opposite to the insulating layer 203 on the lower surfaces 205 of the lines 202). Additionally, as illustrated in FIG. 2E, the diffusing barrier layer 204 is formed along opposing lateral sides or lateral surfaces 207, 208 of the lines 202. Accordingly, in the illustrated embodiment, following the task of forming the diffusing barrier layer 204, the lines 202 are surrounded on all sides 205, 206, 207, 208 by an insulating material and/or a diffusing barrier material (e.g., the diffusing barrier layer 204 is on the lateral sides 207, 208 and the upper surfaces 206 of the lines 202, and the insulating layer 203 is on the lower surfaces 205 of the lines 202).

Figure 2F:
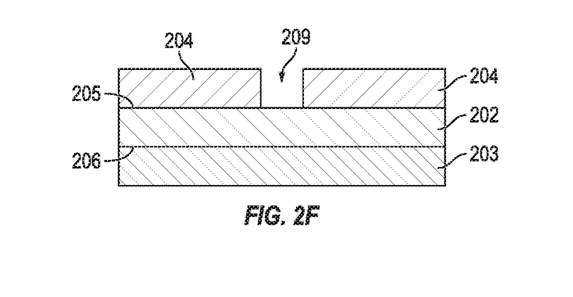
FIGS. 2F-2G are a side view and a top view, respectively, illustrating a further task of forming the metallic interconnects according to one embodiment of the present disclosure.
Figure 2G:
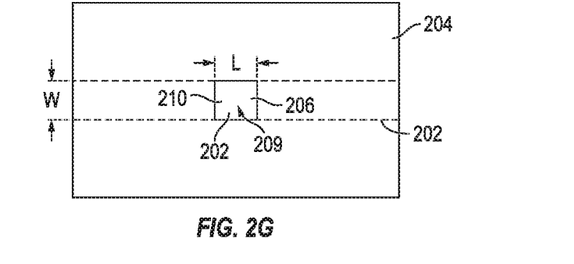

With reference now to FIGS. 2F-2G, the method of forming the metallic interconnects 200 also includes forming at least one opening 209 (e.g., a via-like opening) in the diffusing barrier layer 204 (e.g., forming at least one opening 209 in the upper insulating layer). In one or more embodiments, each of the at least one openings 209 in the diffusing barrier layer 204 may have a length L from approximately 10 nm to approximately 20 nm. In one or more embodiments, the length L of the at least one opening 209 in the diffusing barrier layer 204 may be less than approximately 10 nm. In one or more embodiments, the length L of the at least one opening 209 in the diffusing barrier layer 204 may be up to approximately 30 nm. In one or more embodiments, the method may include forming at least one opening 209 in the diffusing barrier layer 204 for each of the lines 202 of the interconnect layout 201. In the illustrated embodiment, the at least one opening 209 extends completely through the diffusing barrier layer 204 and exposes a portion 210 of the upper surface 206 of the corresponding underlying line 202 (e.g., the method includes forming at least one through hole 209 in the diffusing barrier layer 204). In one or more embodiments, for each of one or more of the lines 202, the method may include forming two or more discrete openings 209 in the diffusing barrier layer 204 along the length of the corresponding underlying line 202 (e.g., forming a series of discrete openings 209 in the diffusing barrier layer 204 along the length of the corresponding underlying line 202). In one or more embodiments, the openings 209 may be regularly or substantially regularly spaced apart along the length of the underlying line 202 (e.g., the openings 209 in the diffusing barrier layer 204 may be spaced apart with a uniform or substantially uniform interval or pitch along the length of the underlying line 202). Additionally, in one or more embodiments, the one or more openings 209 formed in the diffusing barrier layer 204 may have a width w equal or substantially equal to the width W of the underlying line 202.

Figure 2H:
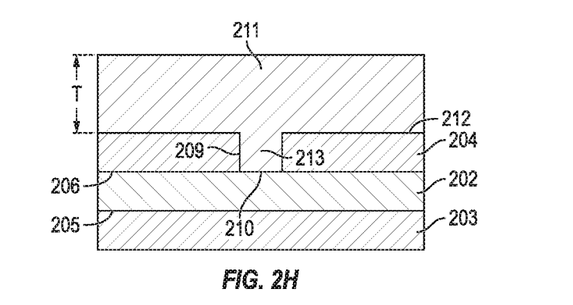
FIGS. 2H-2I are a side view and a top view, respectively, illustrating a task of forming the metallic interconnects according to one embodiment of the present disclosure.
Figure 2I:
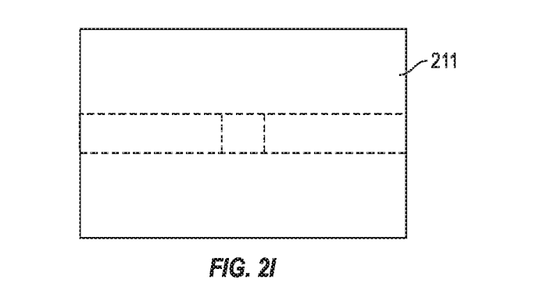

With reference now to FIGS. 2H-2I, the method of forming the metallic interconnects 200 also includes a task of forming (e.g., depositing) a diffusing layer 211 on the diffusing barrier layer 204 (e.g., the upper insulating layer). Following the task of forming the diffusing layer 211, the diffusing layer 211 is on an upper surface 212 of the diffusing barrier layer 204 and a portion or portions 213 of the diffusing layer 211 extend into each of the openings 209 in the diffusing barrier layer 204. The at least one portion 213 of the diffusing layer 211 that extends into the at least one opening 209 in the diffusing barrier layer 204 contacts (e.g., directly contacts) the portion 210 of the upper surface 206 of the corresponding line 202 that was exposed by the opening 209 in the diffusing barrier layer 204. In the illustrated embodiment, the diffusing layer 211 contacts the underlying lines 202 only at the one or more openings 209 in the diffusing barrier layer 204. In one or more embodiments, the diffusing layer 211 may comprise a metal (e.g., Nickel (Ni)) or a metal alloy (e.g., a Ni alloy). In one or more embodiments, the thickness of the diffusing layer 211 may be selected depending on the size (e.g., thickness and/or width) of the underlying lines 202. For instance, as described in more detail below with reference to FIGS. 2J-2K, the thickness T of the diffusing layer 211 may be selected such that the diffusing layer 211 contains sufficient material to at least partially chemically diffuse (e.g., silicidize) the underlying lines 202 of the interconnect layout 201. In one or more embodiments, the thickness T of the diffusing layer 211 may be selected such that the diffusing layer 211 contains sufficient material to completely or substantially completely chemically diffuse (e.g., silicidize) the underlying lines 202 of the interconnect layout 201.

Figure 2J:
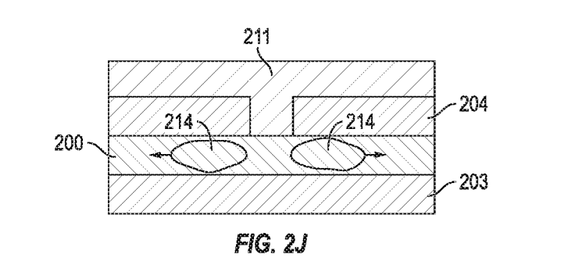
FIGS. 2J-2K are a side view and a top view, respectively, illustrating a task of forming the metallic interconnects according to one embodiment of the present disclosure.
Figure 2K:
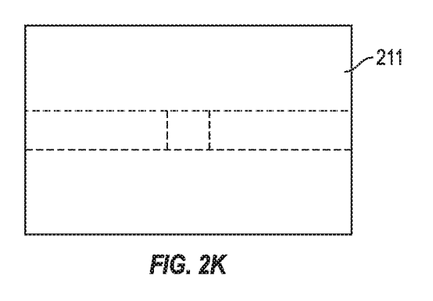

With reference now to FIGS. 2J-2K, the method of forming the metallic interconnects 200 also includes a task of reacting the diffusing layer 211 thermally (e.g., reacting the metal and/or the metal alloy of the diffusing layer 211 by one or more thermal processes) at an elevated temperature. In one or more embodiments, the elevated temperature utilized during the task of thermally reacting the diffusing layer 211 may be from approximately 350° C. to approximately 550° C. (e.g., from approximately 400° C. to approximately 500° C.). In one or more embodiments, the task of thermally reacting the diffusing layer 211 may be performed by any suitable process or combination of processes, such as rapid thermal processing (RTP) or short pulse laser annealing (e.g., ms laser annealing). During the task of thermally reacting the diffusing layer 211, the diffusing material of the diffusing layer 211 (e.g., the metal or the metal alloy) chemically diffuses into the underlying lines 202. The chemical diffusion of the diffusing material into the underlying lines 202 causes one or more crystalline grains 214 grow along the length of the underlying line 202 and thereby metalizes the underlying lines 202 to form the metallic interconnects 200. As used herein, the terms "metalize" and "metallization" refer to forming a metallic compound by a thermal reaction in a binary diffusion couple with one main diffusing species. In one or more embodiments in which the underlying lines 202 are formed of a-Si or poly-Si, the task of thermally reacting the diffusing layer 211 silicidizes the underlying lines 202 such that the resultant metallic interconnects 200 are formed of silicide. In one or more embodiments, the task of thermally reacting the diffusing layer 211 to chemically diffuse the diffusing material of the diffusing layer 211 (e.g., the metal or the metal alloy) into the underlying lines 202 may completely or substantially completely metalize the underlying lines 202. For instance, in one or more embodiments in which the lines 202 are formed of a-Si or poly-Si, the lines 202 may be completely or substantially completely silicidized during the task of thermally reacting the diffusing layer 211.

In the illustrated embodiment, the lines 202 are covered by the diffusing barrier layer 204 (e.g., the upper insulating layer), except at the one or more openings 209 in the diffusing barrier layer 204. Accordingly, the growth of the one or more crystalline grains 214 in the lines 202 (e.g., the silicidation of the lines 202), which occurs during the task of thermally reacting the diffusing layer 211, proceeds laterally along the lines 202 under the diffusing barrier layer 204 from the one or more discrete openings 209 in the diffusing layer 204. That is, the interface between the exposed portion 210 of the underlying line 202 and the portion 213 of the diffusing layer 211 in the one or more discrete openings 209 in the diffusing barrier layer 204 define one or more discrete nucleation sites from which the growth of the one or more crystalline grains 214 in the lines 202 proceeds (e.g., one or more discrete nucleation sites from which the metallization (e.g., silicidation) of the lines 202 proceeds). Initiating the metallization (e.g., silicidation) of the lines 202 at the one or more nucleation sites defined by the interface between the exposed portion 210 of the underlying line 202 and the portion 213 of the diffusing layer 211 in the one or more discrete openings 209 in the diffusing barrier layer 204 is configured to create longer crystalline grains 214 in the metallic interconnects 200 (e.g., the silicidized lines) than in interconnects formed by related art processes in which the metal compound (e.g., the silicide) nucleates entirely along the surface of the lines. For instance, in one or more embodiments, the one or more crystalline grains 214, which form in the lines 202 during the task of thermally reacting the diffusing layer 211, may grow to a length of approximately 20 nm to approximately 200 nm along the length of the lines 202. In one or more embodiments, the one or more crystalline grains 214 may grow to a length of approximately 30 nm or more, approximately 50 nm or more, approximately 100 nm or more, or approximately 200 nm or more along the length of the lines 202. In one or more embodiments, the one or more crystalline grains 214 may grow to a length from approximately 50 nm to approximately 100 nm along the length of the lines 202. In one or more embodiments, the one or more crystalline grains 214 may grow to a length along the lines up to approximately 3 times the lateral length L of each of the one or more openings 209 in the diffusing barrier layer 211. In one or more embodiments, the one or more crystalline grains 214 may grow to a length along the lines 202 greater than 3 times the lateral length L of each of the one or more openings 209 in the diffusing barrier layer 204.

Accordingly, the metallic interconnects 200 formed according to the above-described method may include crystalline grains 214 having a length of 20 nm or greater, approximately 30 nm or greater, approximately 50 nm or greater, approximately 100 nm or greater, approximately 200 nm or greater, or up to approximately 500 nm. The relatively longer crystalline grains 214 of the metallic interconnects 200 formed according to the above-described method is configured to reduce the electrical resistance in the metallic interconnects compared to related art metallic interconnects having relatively shorter grain lengths. In one or more embodiments, each of the metallic interconnect lines formed according to the above-described method may include a single crystalline grain.

In one or more embodiments, the task of thermally reacting the diffusing layer 211 to chemically diffuse the diffusing material of the diffusing layer 211 (e.g., the metal or the metal alloy) into the underlying lines 202 may only partially metalize the underlying lines 202. For instance, in one or more embodiments in which the lines 202 are formed of a-Si or poly-Si, the lines 202 may be only partially silicided during the task of thermally reacting the diffusing layer 211 such that the a-Si or poly-Si remains in at least a portion of the lines 211 following the task of thermally reacting the diffusing layer 211. In one or more embodiments in which the task of thermally reacting the diffusing layer 211 only partially metalizes the underlying lines 202, the method may include a task of annealing the lines 202 to complete the full metallization of the underlying lines (e.g., the method may include a task of annealing the lines 202 to complete the full silicidation of the lines 202).

Figure 2L:
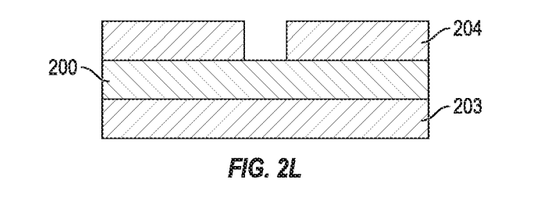
FIGS. 2L-2M are a side view and a top view, respectively, illustrating a task of forming the metallic interconnects according to one embodiment of the present disclosure.
Figure 2M:
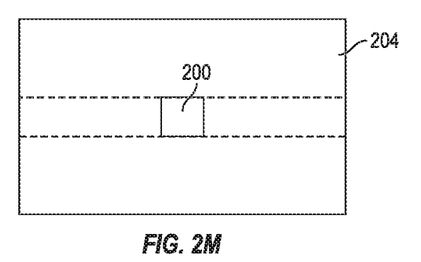

With reference now to FIGS. 2L-2M, the method includes a task of selectively removing the remaining portion of the diffusing layer 211 on the diffusing barrier layer 204 following the task of thermally reacting the diffusing layer 211. Additionally, in one or more embodiments, the method may optionally include a task of selectively removing the diffusing barrier layer 204 (e.g., the upper insulating layer) on the upper surface of the metallic interconnects 200 (e.g., the silicided lines) following the task of thermally reacting the diffusing layer 211. In one or more embodiments, following the task of removing the diffusing barrier layer 204, an insulating layer may be formed on the upper surface of the metallic interconnects 200 (e.g., the silicided lines).

In one or more embodiments, the task of selectively removing the remaining portion of the diffusing layer 211 (e.g., the unreacted portion of the diffusing layer 211) may be performed after the task of thermally reacting the diffusing layer 211, and the task of annealing the lines 202 to complete the full metallization (e.g., the complete or full silicidization of the lines 202) may be performed after the task of selectively removing the unreacted portion of the diffusing layer 211. In one or more embodiments, the task of annealing the lines 202 may immediately follow the task of removing the unreacted portion of the diffusing layer 211 or may be performed or at any other suitable stage of the process.

Following the task of forming the metallic interconnects 200, various back-end-of-line (BEOL) processes may be performed to complete formation of the integrated circuit, such as definition and formation of vias or via-metal interconnect layers on the metallic interconnects 200.

Figure 3A:
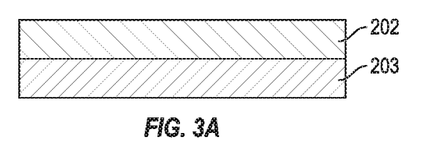
FIGS. 3A-3B are a side view and a top view, respectively, illustrating a task of forming metallic interconnects according to another embodiment of the present disclosure.
Figure 3B:
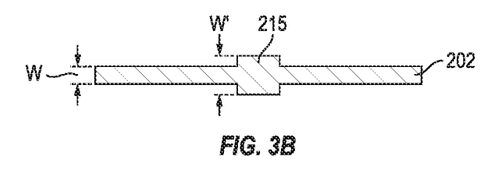

With reference now to FIGS. 3A-3B, in one or more embodiments, the method of forming the metallic interconnects 200 may include a task of forming one or more landing pads 215 in the lines 202. The landing pads have a width W' that is greater than the width W of remaining portions of the lines 202. In one or more embodiments, the landing pads 215 may be square or substantially square. In one or more embodiments, the task of forming the landing pads 215 in the lines 202 may be performed during the task of forming the interconnect layout 201 illustrated in FIGS. 2A-2B (e.g., the task of forming the landing pads 215 in the lines 202 may be performed during the task of patterning the deposited non-diffusing material (e.g., by etching) to form the lines 202, or the task of forming the landing pads 215 may be performed during the task of conformally depositing the non-diffusing material in a damascene trench pattern in an insulating layer). In one or more embodiments, the one or more openings 209 formed in the diffusing barrier layer 204, as illustrated in FIGS. 2F-2G, may be aligned or substantially aligned with the one or more landing pads 215 of the lines 202. In one or more embodiments, the vias formed during the BEOL processes may be connected to the landing pads 215. In one or more embodiments, the size of the landing pads 215 may be the same or substantially the same as the size of the openings 209 formed in the diffusing barrier layer 204 and/or the size of the vias formed during the BEOL processes.

FIGS. 4A-4H depict tasks of forming metallic interconnects 300 for an integrated circuit according to another embodiment of the present disclosure. In FIGS. 4A-4H, the underlying structure of the integrated circuit (e.g., transistors) on which the metallic interconnects 300 are formed is omitted for clarity.

Figure 4A:
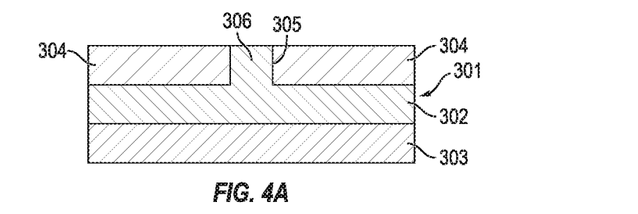
FIGS. 4A-4B are a side view and a top view, respectively, illustrating a task of forming metallic interconnects according to another embodiment of the present disclosure.
Figure 4B:
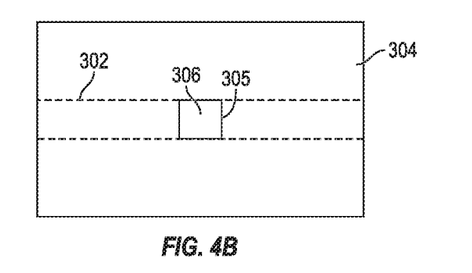

In the embodiment illustrated in FIGS. 4A-4B, the method of forming the metallic interconnects 300 includes forming an interconnect layout 301 including a series of lines 302 (e.g., lines formed of a non-diffusing material, such as a semi-conductor material such as a-Si, poly-Si, or SiGe) on an insulating layer 303, and forming (e.g., depositing) a diffusing barrier layer 304 (e.g., an insulating material) on the lines 302 of the interconnect layout 301.

As illustrated in FIGS. 4A-4B, the method of forming the metallic interconnects 300 also includes forming at least one opening 305 (e.g., a via-like opening) in the diffusing barrier layer 304, and at least partially filling the one or more openings 305 in the diffusing barrier layer 304 with a semiconductor material (e.g., a-Si, poly-Si, or SiGe). The one or more openings 305 may by any suitable size, for instance, as described above with reference to the embodiment illustrated in FIGS. 2A-2M. In the illustrated embodiment, the semiconductor material in the one or more openings 305 is the same as the semiconductor material of the lines 302 such that a portion 306 of the line 302 extends up into the opening 305 in the diffusing barrier layer 304. The one or more openings 305 may be at least partially filled with the semiconductor material by any suitable process (e.g., the semiconductor material may be deposited in the one or more openings 305 in the diffusing barrier layer 304).

Figure 4C:
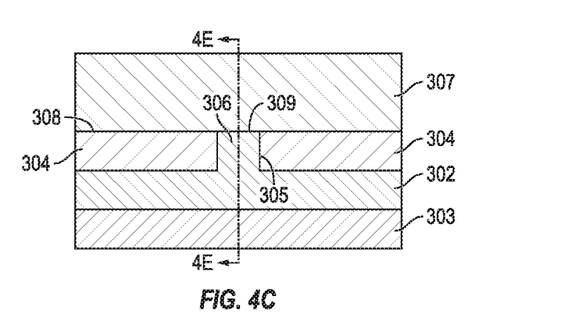
FIGS. 4C-4E are a side view, a top view, and a cross-sectional view, respectively, illustrating another task of forming the metallic interconnects according to one embodiment of the present disclosure.
Figure 4D:
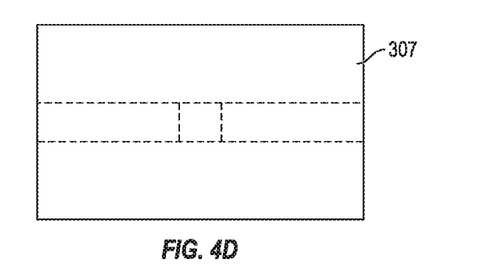
Figure 4E:
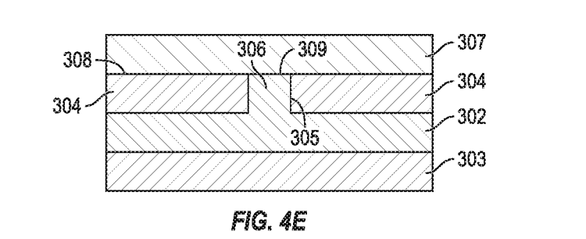

With reference now to the embodiment illustrated in FIGS. 4C-4E, the method of forming the metallic interconnects 300 also includes a task of forming (e.g., depositing) a diffusing layer 306 (e.g., a layer of metal such as Ni or a layer of metal alloy such as Ni alloy) on the diffusing barrier layer 304 (e.g., the upper insulating layer). Following the task of forming the diffusing layer 307, the diffusing layer 307 is on an upper surface 308 of the diffusing barrier layer 304 and an upper surface 309 of the portion 306 of the line 302 that extends up into the opening 305 in the diffusing barrier layer 304. In the illustrated embodiment, the diffusing layer 307 contacts the underlying lines 302 only at the one or more openings 305 in the diffusing barrier layer 304. Accordingly, unlike the embodiment of the method illustrated in FIGS. 2A-2M in which the diffusing layer 211 extends down through the opening 209 in the diffusing barrier layer 204 and contacts the underlying lines 202, in the embodiment of the method illustrated in FIGS. 4A-4I, a portion 306 of the underling line 302 extends up through the opening 305 in the diffusing barrier layer 304 and contacts the diffusing layer 307.

Figure 4F:
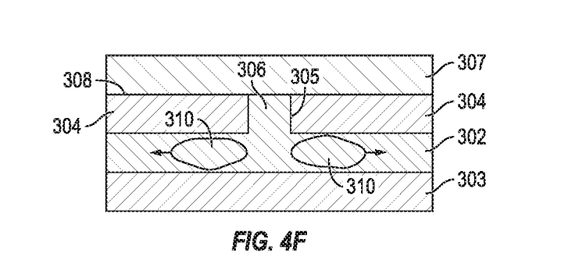
FIGS. 4F-4G are a side view and a top view, respectively, illustrating a further task of forming the metallic interconnects according to one embodiment of the present disclosure.
Figure 4G:
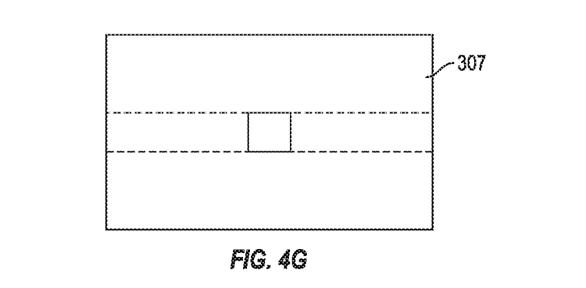

With reference now to FIGS. 4F-4G, the method of forming the metallic interconnects 300 also includes a task of thermally reacting the diffusing layer 307. During the task of thermally reacting the diffusing layer 307, the diffusing material of the diffusing layer 307 (e.g., the metal or the metal alloy) chemically diffuses into the underlying lines 302. The chemical diffusion of the diffusing material into the underlying lines 302 causes one or more crystalline grains 310 grow along the length of the underlying line 302 and thereby metalizes the underlying lines 302 to form the metallic interconnects 300. The task of thermally reacting the diffusing layer 306 may be the same as or similar to the task of thermally reacting the diffusing layer 211 described above with reference to FIGS. 2J-2K.

Figure 4H:
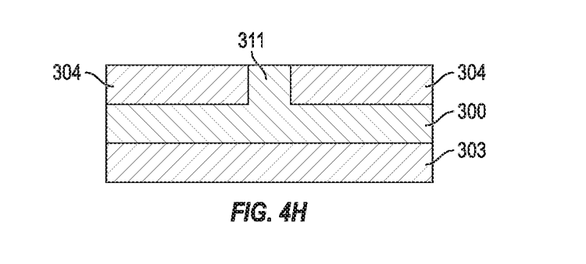
FIGS. 4H-4I are a side view and a top view, respectively, illustrating a task of forming the metallic interconnects according to one embodiment of the present disclosure.
Figure 4I:
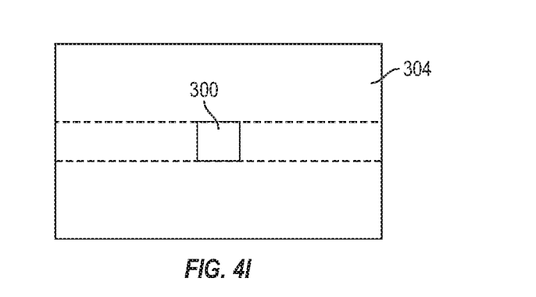

With reference now to FIGS. 4H-4I, the method includes a task of selectively removing the remaining portion of the diffusing layer 306 on the diffusing barrier layer 304 following the task of thermally reacting the diffusing layer 306. Additionally, in one or more embodiments, the method may optionally include a task of selectively removing the diffusing barrier layer 304 (e.g., the upper insulating layer) on the metallic interconnects 300 (e.g., the silicided lines) following the task of thermally reacting the diffusing layer 306. In one or more embodiments, following the task of removing the diffusing barrier layer 304, an insulating layer may be formed on the metallic interconnects 300 (e.g., the silicided lines).

Following the task of forming the metallic interconnects 300, various back-end-of-line (BEOL) processes may be performed to complete formation of the integrated circuit, such as definition and formation of vias or via-metal interconnect layers on the metallic interconnects 300. In one or more embodiments, one or more portions 311 of the metallic interconnects 300 that were formed from the one or more portions 306 of the lines 302 extending up into the one or more openings 305 in the diffusing barrier layer 304 may be utilized as vias connecting the metallic interconnects 300 to upper metal layers in the BEOL.

Figure 5:
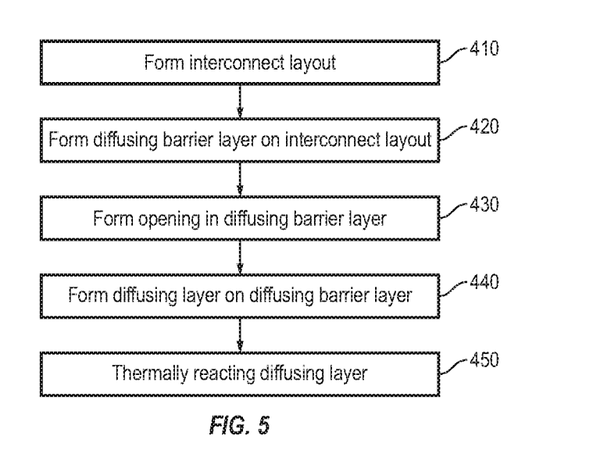
FIG. 5 is a flowchart illustrating tasks of a method of manufacturing metallic interconnects according to one embodiment of the present disclosure.

FIG. 5 is a flowchart illustrating tasks of a method 400 of manufacturing metallic interconnects according to one embodiment of the present disclosure. As illustrated in FIG. 5, the method includes a task 410 of forming an interconnect layout including a series of lines on an insulating layer. The lines may be formed from a non-diffusing material, such as a semi-conductor material (e.g., amorphous silicon (a-Si), poly silicon (poly-Si), or SiGe). In one or more embodiments, the lines may be formed by depositing the non-diffusing material and then patterning the deposited non-diffusing material (e.g., by etching) to form the lines, or the lines may be formed by conformal deposition of the non-diffusing material in a damascene trench pattern in an insulating layer.

In the illustrated embodiment, the method also includes a task 420 of forming (e.g., depositing) a diffusing barrier layer on the lines of the interconnect layout (e.g., covering the lines with the diffusing barrier layer). In one or more embodiments, the diffusing barrier layer may include an insulating material.

With continued reference to FIG. 5, the method also includes a task 430 of forming at least one opening (e.g., a via-like opening) in the diffusing barrier layer. In one or more embodiments, the task 430 may include forming a series of discrete openings in the diffusing barrier layer along the length of the corresponding underlying line. The openings may by any suitable size, for instance, as described above with reference to the embodiment illustrated in FIGS. 2A-2M.

In the illustrated embodiment, the method also includes a task 440 of forming (e.g., depositing) a diffusing layer on the diffusing barrier layer. The diffusing layer may be formed of a metal (e.g., Nickel (Ni)) or a metal alloy (e.g., a Ni alloy). In one or more embodiments, a portion or portions of the diffusing barrier layer may extend down into the one or more openings in the diffusing barrier layer (e.g., as illustrated in FIGS. 2H-2I). In one or more embodiments, a portion or portions of the lines may extend up into the one or more openings in the diffusing barrier layer (e.g., as illustrated in FIGS. 4A-4D).

As illustrated in FIG. 5, the method also includes a task 450 of reacting the diffusing layer thermally at an elevated temperature (e.g., from approximately 350° C. to approximately 550° C., or from approximately 400° C. to approximately 500° C.). In one or more embodiments, the task 450 of thermally reacting the diffusing layer may be performed by any suitable process or combination of processes, such as rapid thermal processing (RTP) or short pulse laser annealing (e.g., ms laser annealing). During the task 450 of thermally reacting the diffusing layer, the diffusing material of the diffusing layer chemically diffuses into the underlying lines, which causes one or more crystalline grains grow along the length of the underlying line and thereby metalize (e.g., silicidize) the underlying lines to form the metallic interconnects. One or more interfaces between the underlying lines and the diffusing layer at the one or more openings in the diffusing barrier layer define one or more discrete nucleation sites from which the growth of the one or more crystalline grains in the lines proceeds, which results in longer crystalline grains in the metallic interconnects compared to metallic interconnects formed according to related art methods in which the silicide nucleates entirely along the surface of the lines.

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims.

What is claimed is:

1. An interconnect for an integrated circuit, comprising:
a pattern of metallic interconnect lines,
wherein each crystalline grain of at least one metallic interconnect line of the pattern has a length from approximately 20 nm to approximately 500 nm, the length of each crystalline grain being oriented along a length of the at least one metallic interconnect line,
wherein the at least one metallic interconnect line of the pattern has a width in a range from approximately 10 nm to approximately 20 nm, and
wherein the at least one metallic interconnect line of the pattern comprises silicide.

* * * * *